(12) United States Patent  
Straboni

(10) Patent No.: US 8,105,923 B2
(45) Date of Patent: *Jan. 31, 2012

(54) SINTERED SEMICONDUCTOR MATERIAL

(75) Inventor: Alain Straboni, Buxerolles (FR)

(73) Assignees: Centre National de la Recherche Scientifique, Paris (FR); Universite de Poitiers, Poitiers (FR)

( * ) Notice: Subject to any disclaimer, the term of this patent is extended or adjusted under 35 U.S.C. 154(b) by 913 days.

This patent is subject to a terminal disclaimer.

(21) Appl. No.: 10/552,548

(22) PCT Filed: Apr. 9, 2004

(86) PCT No.: PCT/FR2004/050151
§ 371 (c)(1),
(2), (4) Date: Jan. 3, 2007

(87) PCT Pub. No.: WO2004/093202
PCT Pub. Date: Oct. 28, 2004

(65) Prior Publication Data
US 2007/0178675 A1 Aug. 2, 2007

(30) Foreign Application Priority Data

Apr. 14, 2003 (FR) ...................................... 03 04676

(51) Int. Cl.
*H01L 21/04* (2006.01)
(52) U.S. Cl. ...................................................... 438/510
(58) Field of Classification Search .................. 438/510; 264/614
See application file for complete search history.

(56) References Cited

U.S. PATENT DOCUMENTS

| 3,151,379 | A | * | 10/1964 | Escoffery .......................... 438/80 |
| 4,281,208 | A | | 7/1981 | Kuwano et al. |
| 4,390,743 | A | | 6/1983 | Dahlberg |
| 4,759,887 | A | | 7/1988 | Geissler et al. |
| 4,762,687 | A | | 8/1988 | Belouet et al. |
| 4,849,033 | A | | 7/1989 | Vander Sande et al. |
| 4,851,358 | A | | 7/1989 | Huber |
| 4,960,721 | A | | 10/1990 | Terashima et al. |
| 5,378,289 | A | | 1/1995 | Noguchi et al. |
| 5,431,127 | A | * | 7/1995 | Stevens et al. ................... 117/75 |
| 5,770,324 | A | | 6/1998 | Holmes et al. |
| 6,348,428 | B1 | | 2/2002 | Misu et al. |
| 6,494,959 | B1 | | 12/2002 | Samoilov et al. |

(Continued)

FOREIGN PATENT DOCUMENTS

DE 2258305 5/1974

(Continued)

OTHER PUBLICATIONS

Santana C. J. et al., "The Effects of Processing Conditions on the Density and Microstructure of Hot-Pressed Silicon Powder", Journal of Materials Science, vol. 31, 1996, pp. 4985-4990.

(Continued)

*Primary Examiner* — Bradley K Smith
(74) *Attorney, Agent, or Firm* — Howard IP Law Group, PC

(57) ABSTRACT

The invention relates to a method for forming a semiconductor material obtained by sintering powders and to a semiconductor material. The method comprises a compression and heat treatment stage such that one part of the powder is melted or becomes viscous. The material can be used in the photovoltaic field.

12 Claims, 5 Drawing Sheets

U.S. PATENT DOCUMENTS

| | | | |
|---|---|---|---|
| 6,849,242 | B1 | 2/2005 | Koeppler et al. |
| 6,916,356 | B2 | 7/2005 | Margaria |
| 7,002,071 | B1 | 2/2006 | Sadatomi et al. |
| 7,563,404 | B2 * | 7/2009 | Straboni ............ 264/614 |
| 2002/0005213 | A1 | 1/2002 | Otsuki et al. |
| 2002/0166256 | A1 | 11/2002 | Samoilov et al. |
| 2006/0048698 | A1 | 3/2006 | Hall et al. |
| 2007/0014682 | A1 * | 1/2007 | Hariharan et al. ......... 419/36 |
| 2009/0068465 | A1 * | 3/2009 | Chen et al. ............ 428/378 |

FOREIGN PATENT DOCUMENTS

| | | |
|---|---|---|
| DE | 19859288 | 6/2000 |
| EP | 0230617 A1 | 8/1987 |
| EP | 0977274 | 2/2000 |
| FR | 2038715 | 1/1971 |
| FR | 2479276 | 10/1981 |
| FR | 2666453 A1 | 3/1992 |
| FR | 2814757 A1 | 4/2002 |
| GB | 1065773 | 4/1967 |
| JP | 5314914 B | 5/1978 |
| JP | 5229812 A | 9/1993 |
| JP | 9165212 A | 6/1997 |
| JP | 11092129 A | 4/1999 |
| JP | 11323538 | 11/1999 |
| JP | 2002151713 | 5/2002 |
| JP | 2002-533289 | 10/2002 |
| JP | 2003124483 A | 4/2003 |
| WO | 9721253 A1 | 6/1997 |
| WO | 0068999 | 11/2000 |

OTHER PUBLICATIONS

Bere E. et al., "A New Technology for the Production of Silicon Sheets by Sintering of Silicon Powder Beds"17th E.C. Photovoltaic Solar Energy Conference, Munich Germany Oct. 22-26, 2001, Proceedings of the International Photovoltaic Solar Energy Conference, Munich: WIP-Renewable Energies, DE, vol. 2 of 3 Conf. 17, Oct. 22, 2001, pp. 1799-1801.

Belogorokhov A. I. et al, "Optical characterization of porous silicon embedded with CdSe nanoparticles", Applied Physics Letters, American Institute of Physics. New York, US, vol. 73, No. 19, Nov. 19, 1998, pp. 2766-2768.

International Search Report dated Sep. 27, 2004 for related PCT Application No. PCT/FR2004/050151.

International Search Report date Oct. 4, 2004 for related International application PCT/FR2004/050152.

Chatterjee S. et al., "A miniature PTC thermistor based sensor element fabricated by tape casting technique", Sensors and Actuators B, Elsevier Sequoia, S.A. Lausanne, CH, vol. 60, No. 2-3, Nov. 23, 1999, pp. 155-160.

Selvan, R. K. et al., "Combustion synthesis of CuFe2O4", Materials Research Bulletin, Elsevier Science Publishing, New York, US, vol. 38, No. 1, Jan. 1, 2003, pp. 41-54.

English version of Japanese Office Action, dated Jun. 1, 2010.

French Search Report dated Jun. 29, 2010 for related French application No. FR 0958441.

* cited by examiner

SINTERED SEMICONDUCTOR MATERIAL

CLAIM FOR PRIORITY

This application claims the benefit of French Application No. 03/04676, filed Apr. 14, 2003 and Intl. Application No. PCT/FR2004/050151, filed Apr. 9, 2004 and is incorporated herein by reference.

The present invention relates to the field of semiconductors, and in particular, but not exclusively, of semiconductor materials usable to form photovoltaic cells, also called photocells.

FIG. 1 shows a conventional photovoltaic cell 1. Photovoltaic cell 1 comprises a planar semiconductor material 3. Material 3, generally made of polysilicon, comprises three areas of different doping. A thick central area 3a is lightly P-type doped. An upper area 3b is N-type doped, and possibly overdoped at its surface. A lower area 3c is heavily P-type doped ($P^+$). A conductive comb 5 is placed above area 3b, intended to be exposed to light. An aluminum layer 6 covers the lower surface of the cell. Comb 5 and layer 6 are both intended to transmit the photovoltaic current and are connected to the + and − terminals, not shown, of the cell. An antireflection layer, not shown, is preferably placed on area 3b and comb 5 to limit the reflection of light rays at the photocell surface.

Material 3 conventional originates from a polysilicon bar obtained from a silicon melt. The bar is sawn to obtain wafers which are then doped to obtain material 3. This manufacturing method, close to the single-crystal silicon wafer manufacturing method, is expensive and limits the possible wafer dimensions.

The inventor has disclosed in a conference in Munich (17$^{th}$ European Photovoltaic Solar Energy Conference and Exhibition, Munich, 21-26 Oct. 2001) a method for manufacturing polysilicon wafers by sintering of silicon powders. In this method, silicon powders of 5 µm or 20 µm are placed between the plates of a press. The assembly is compressed with a pressure P ranging between 70 MPa (700 bars) and 900 MPa (9,000 bars). Then, the compacted layer is introduced into a sintering furnace, where it is heated up to a temperature T ranging between 950° C. and 1050° C. The sintering, which enables growth of bridges between the grains and stiffening of the material, has been performed at the indicated temperatures for a time range from two to eight hours, under a low argon pressure (100 Pa).

The obtained materials have a sufficient mechanical strength to be able to be handled. However, their porosity is high, above 15%. Further, the grain size is small, since the size of said grains has not substantially increased during the processing. The mobility-lifetime product of the minority carriers is low, on the order of $10^{-7}$ cm$^2$V$^{-1}$ ($10^{-11}$ m$^2$V$^{-1}$ in the international system). The obtained materials are unusable in the photovoltaic field. For example, due to the high porosity, it is impossible to dope a specific area of the material, the dopants migrating through the porosity channels and spreading everywhere inside the material. As to the mobility-lifetime product of the minority carriers, values at least one thousand times greater are required for the material to be used in a photocell. Further, the surface of the obtained materials is uncontrolled and rough. Such a surface state prevents the provision of surface junctions, necessary poor, in particular because of significant leakage currents.

An object of the present invention is to form a semiconductor material or component by sintering of semiconductor powders usable in the electronic field, especially in the photovoltaic field.

Another object of the present invention is to form a semiconductor material by sintering of semiconductor powders exhibiting a low roughness and/or a controlled texturation surface condition.

To achieve these objects, the present invention provides a method for forming a semiconductor material from powders comprising at least one component belonging to the group formed by the elements of column IV of the Mendeleiev table and their alloys. The method comprises a step of compression of said powders and a thermal processing step such that part at least of the powders is melted or made viscous.

According to an embodiment of the present invention, the compression and thermal processing steps are simultaneous.

According to an embodiment of the present invention, the thermal processing is such that only powders belonging to a specific area of the material are melted or made viscous.

According to an embodiment of the present invention, the powders comprise silicon powders and powders of at least another component, the thermal processing being such that the silicon is not melted and that at least one of the other components is melted or made viscous.

According to an embodiment of the present invention, the powders comprise doped semiconductor powders and undoped semiconductor powders, the thermal processing being such that only the doped powders are melted.

According to an embodiment of the present invention, the compression step is preceded by a step consisting of placing powders on a plate, the powders being different as to their nature, their granulometry, and/or their doping according to their location on the plate.

According to an embodiment of the present invention, in the compression step, said powders are pressed between plates having a surface capable of texturizing the surface of the material.

The present invention also provides a semiconductor material obtained at least partially by compression and thermal processing of powders comprising at least two distinct areas formed of distinct components belonging to the group formed by the elements of column IV of the Mendeleiev table and the alloys thereof.

According to an embodiment of the present invention, said areas are superposed.

The present invention also provides a structure or component formed of one or comprising at least one semiconductor material comprising grains and/or aggregates exhibiting energy gaps of different value.

The foregoing and other objects, features, and advantages of the present invention will be discussed in detail in the following non-limiting description of specific embodiments in connection with the accompanying drawings, among which:

Figure 1:
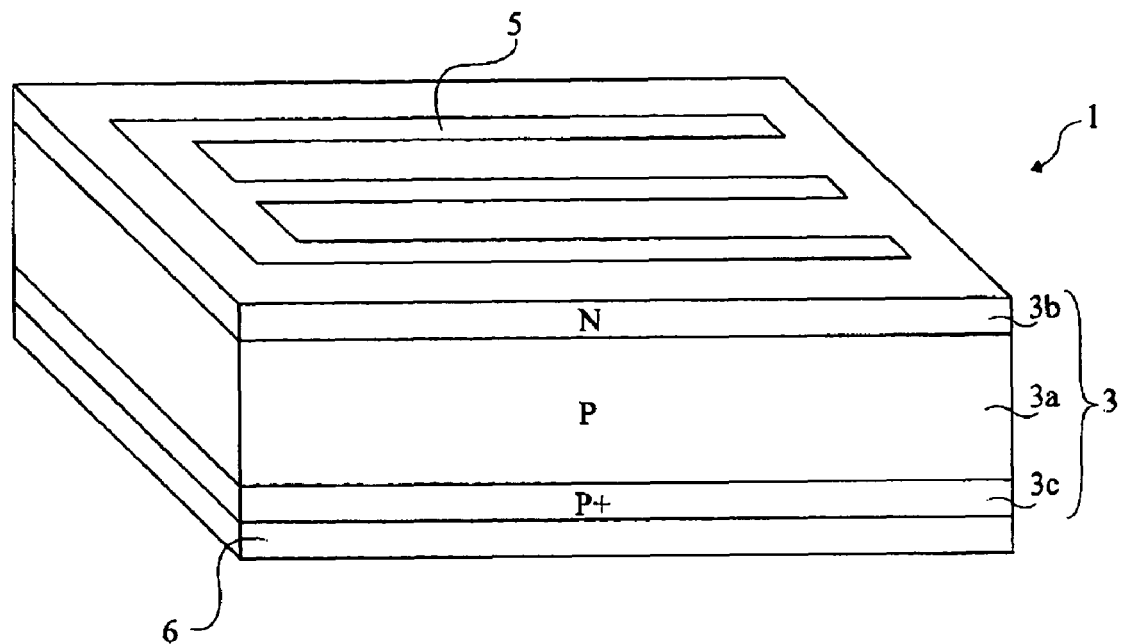
FIG. 1 shows a conventional photovoltaic cell.

On a lower plate 10 is placed a bed of semiconductor powders 15, for example, silicon powders. An upper plate 20 covers powders 15. The assembly is placed in a processing enclosure and semiconductor powder layer 15 is compacted by application of a pressure P. The compaction may be performed by cold pressing, that is, at room temperature, or by hot pressing, at a temperature T, for example ranging between 950 and 1,300° C.

According to the present invention, the sintering is performed at least partially in liquid phase, that is, before or after the compression, a thermal processing such that part at least of the powders is melted, is applied. This is symbolized by letter F in FIG. 2. In the present invention, terms "liquid phase" and "melting" must be understood in a broad sense. As will be seen hereafter, "liquid phase" may also designate a viscous phase corresponding to an overmelted liquid, term "melting" then designating the "overmelting".

The partial melting may be performed in selective fashion, for example, according to the area in the material, to the nature of the powders, or according to the used heating means.

In the areas sintered in liquid phase, the porosity is substantially zero (in practice, lower than 0.2%). Also, the melting causes an increase in the grain size, which is desirable, the obstacle to the displacement of the carriers created by the grain boundaries being then decreased.

Although this is possible, it is not necessary for the entire material to be sintered in liquid phase. Indeed, in its research, the inventor has found that it is not required for the features of a material intended to form a photocell to be homogenous throughout the entire material.

For example, in a photovoltaic cell, the so-called "absorbing" portion, that is, the area intended to turn the received photons into electron-hole pairs, must have a microstructure of very high quality, that is, a porosity as close as possible to zero and the largest possible grain size. The portion forming the junction (or collection area), intended to collect the carriers, must also exhibit this type of features.

However, other areas in the material do not need a high-quality microstructure and may exhibit with no disadvantage a poor porosity. Such areas for example are the heavily-doped N-type or P-type conductive areas used as a contact with the N and P areas of the junction. It is enough for these areas to exhibit a sufficient conductivity, and a porosity as high as 40 or 50% can be sufficient.

Accordingly, according to the present invention, the thermal processing may be carried out to selectively cause a melting only in the areas where a high-quality microstructure is desired.

A few examples of obtained materials will be given hereafter.

A number of trials have been carried out with pressures ranging between 10 MPa and 30 MPa (100 and 300 bars). The temperatures have ranged between 950° C. and 1,350° C. The used powders have been either pure silicon powders, or silicon powders mixed with powders of other elements from column IV of the Mendeleiev table, such as germanium, or silicon powders mixed with powders of non-semiconductor materials, such as silica $SiO_2$. The granulometry of the used powders has ranged between 20 nanometers and 700 micrometers. The obtained results are spectacular. The objects of the present invention have been achieved and materials usable in the photovoltaic field have been obtained.

It should be noted that, according to the present invention, it is possible to easily control the morphology of the surface of the obtained material. Indeed, especially when the partial melting step occurs during the compression, the surface of the material faithfully reproduces the surface of plates 10 and 20.

With planar and smooth plates, the surface, analyzed by electronic microscopy, appears as an even plane with a very low roughness.

It should also be noted that an advantage of performing a hot pressing of the powders, rather than a cold pressing, is that this provides a material exhibiting a low general porosity within a relatively short time, which results in a time, power, and cost saving.

It should also be noted that the liquid phase into which the material passes at least partially may be of very short time, for example, shorter than one minute.

For example, in a practical example, powders of a 20-nanometer size, sintered for half an hour by hot pressing under a 120-bar (12 MPa) pressure at a 1,325° C. temperature, provide a material with a porosity close to 4%. A thermal processing by laser beam causing a surface melting of the material will enable decreasing the porosity of the surface layer of the material down to practically zero.

It should be noted that the partial melting step is not necessarily distinct from the actual sintering step. The partial melting step may be carried out simultaneously to the compression.

Examples of implementation of the method according to the present invention will now be given.

The lower and upper plates are mechanical plates, sufficiently strong to enable the compression. They must be compatible with the nature of the used semiconductor powders to avoid introducing impurities. For example, the plates may be made of graphite or silicon carbide.

The powders of layer 15 for example are powders of pure silicon or silicon enriched in elements from column IV of the Mendeleiev table, such as carbide, germanium, tin, or their alloys. Powders of other semiconductors may also be used, and germanium, gallium arsenide AsGa, etc. materials may be formed by sintering.

The used powders may be of nanometric, micrometric, or even millimetric size. Preferably, the size of the powders is smaller than the thickness of the material which is desired to be obtained. However, it may also be slightly greater, the powders being crushed during the sintering. A mixture of powders of various granulometries may also be performed to form powder bed 15, especially to conveniently and efficiently control the general porosity or that of areas of the obtained material.

The used powders may originate from residues of the sawing of single- or polycrystal semiconductor ingots. Very thin powders resulting from byproducts of the decomposition reactors of the silicon composites, such as silane or trichlorosilane gases, may also be used. Such powders, typically on the order of 20 nanometers, currently have no industrial use. They are very inexpensive and their use makes the method according to the present invention even more economical.

Powder bed 15 may be formed in various manners. For example, one or several powder piles may be placed in various locations of plate 10 and the desired thickness may be equalized by means of a scraper. Powder bed 15 may also be formed by aerosol. In this case, a gas containing floating particles is sent to the processing enclosure. The particles deposit on plate 10 and form powder bed 15. Also, it is possible to use masks to place the powders at specific locations of layer 15.

It should be noted that the conditions of implementation of the method (pressure, thermal processing, powder nature and granulometry, processing time) enable controlling the features of the obtained materials and adjusting them in desired fashion.

A way to obtain the liquid phase (possibly, the viscous phase) is to use of mixture of powders such that part of the components melts (possibly, is made viscous) during the thermal processing which occurs, as it should be reminded, either during the compression step, or after.

For example, a homogenous mixture of germanium and silicon may be formed and brought to a temperature ranging between 937 and 1,410° C. The germanium melts (melting temperature 937° C.), but not the silicon (melting temperature 1410° C.). By melting, the germanium eases the transportation of silicon atoms from one silicon grain to another, as they aggregate. Further, the germanium spreads into the pores and clogs them, which results in the desired decrease in porosity. The same result may be obtained with a mixture of silicon and tin.

A sintering in liquid phase can thus be obtained by mixing powders of various materials, such as glass powders or ceramic materials, with the silicon powders. For example, the silica powders become soft and pasty from approximately 1100° C. and may also be used as a melting agent to sinter the silicon powders. It should be noted that, in this case, it is not properly speaking a liquid phase, and that this term rather designates a viscous phase, resulting from the passing of a component to the overmelted liquid state.

Generally, the liquid phase may be partially or in part evacuated during or after the sintering, for example by an anneal at high temperature, for example greater than 1,200° C. in the case of germanium. The liquid phase evacuation may also be favored by pumping at a pressure lower than the partial pressure of the considered component.

According to the present invention, the mixture of silicon and melting agent powders needs not be homogenous. For example, in a photocell where absorbing portion and junction are on a same surface, the melted portion of the powders only needs involving the surface portion of the mixture. This can be obtained by performing a surface heating by laser beam. This may also be obtained by forming a layer 15 in two sub-layers, a lower sub-layer with silicon powders and an upper sub-layer with a mixture of powders of silicon and melting agent, germanium for example, only the melting agent melting during the sintering. The obtained material is a material comprising a surface area exhibiting a high-quality structure.

The liquid phase may also be obtained by selectively melting powders exhibiting a specific doping type. Thus, for example, in a mixture of doped silicon and pure silicon powders, the doped powders may selectively be melted by induction, since their conductivity is higher than that of silicon.

Of course, in the method according to the present invention, several compression steps and/or several thermal processing steps may take place. The pressure and/or the temperature may vary along the implementation of the method according to the present invention. For example, the pressure may be exerted for a time shorter than the thermal processing. Also, the pressure may be applied intermittently during the thermal processing. Also, the thermal processing may comprise several steps, only one or several of which cause the melting.

It should also be noted that a stacking of several mechanical plates imprisoning several beds of semiconductor powders may be formed, to manufacture a great number of materials at the same time.

Figure 2:
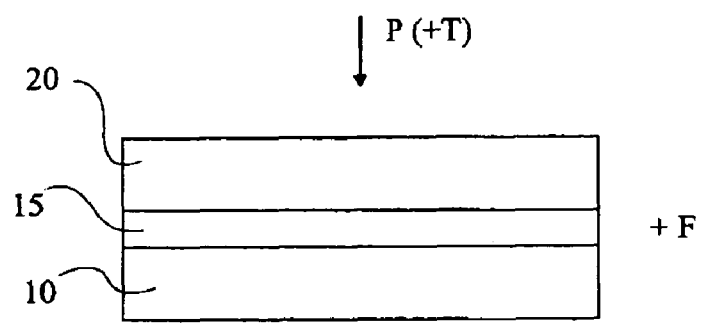
FIG. 2 illustrates an embodiment of the method according to the present invention.
Figure 3:
FIG. 3 shows a material according to the present invention.

FIG. 3 shows a material 25 obtained by the method of FIG. 2. Material 25 appears in the form of a thin wafer, of a thickness typically ranging between 100 and 1000 μm. If need be, greater thicknesses, 2000 μm, for example, or lower thicknesses, such as 50 μm, may be provided. Material 25 is mechanically strong, of adapted porosity and its surface state is optimal. The dimensions of material 25 may be quite large.

Figure 4:
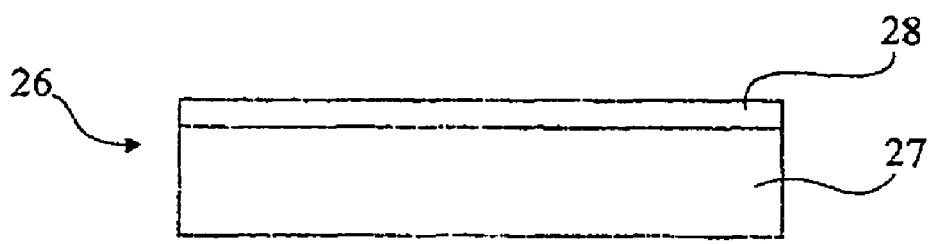
FIG. 4 shows a structure according to the present invention.

FIG. 4 shows a structure 26 according to the present invention. Structure 26 comprises a mechanical support 27, such as an insulating or conductive ceramic, graphite, glass, a metal, or an alloy, on which is fixed a semiconductor material 28. Structure 26 is very robust and may be obtained in several manners. For example, material 25 of FIG. 3 may first be formed and fixed in any manner, for example, by gluing, to support 27. To form support 27, one of the two plates 10 or 20 of a nature such that the semiconductor material adheres thereto during the sintering of the powders of layer 15 may also advantageously be used. Such a plate is for example formed of silicon carbide SiC, silicon nitride $Si_3N_4$, silica glasses enriched or not with boron, phosphorus, nitrogen, etc. Structure 26 is thus directly obtained by the method of FIG. 2. Structure 26 may have any thickness. Support 27 may have a rather low thickness, for example, from one to a few millimeters, or rather high, for example, from one to a few centimeters. Structure 26 will be for example preferred in the case of semiconductor materials 28 of small thickness, for example, 50 micrometers, or when it is desired to form semiconductor wafers of very large dimension.

Material 25 and structure 26, very inexpensive, may be used as a base to form photovoltaic cells, by application of conventional doping, metallization, etc. methods. However, the photovoltaic field is not the only possible application of material 25 or of structure 26.

For example, material 25 or material 28 of structure 26 may be used as a support for semiconductor layers deposited afterwards, which then are the active layers, materials 25 and 28 only being used as a support. This application is particularly advantageous. Indeed, materials 25 and 28 are compatible with the deposited layers, and in particular have the same expansion coefficient. In the deposition of the active layers, for example, in vapor phase, the high temperature then poses no problem of expansion difference between the deposited layers and the plate.

For example, material 25 or structure 26 may form wafers used for components for CCD cameras or flat screens, where such components may comprise transistors in thin layers.

A few possibilities provided by the method according to the present invention, relating to the texturation of the materials, their doping, and the forming of "composite" semiconductor materials, will now be described.

Figure 5A:
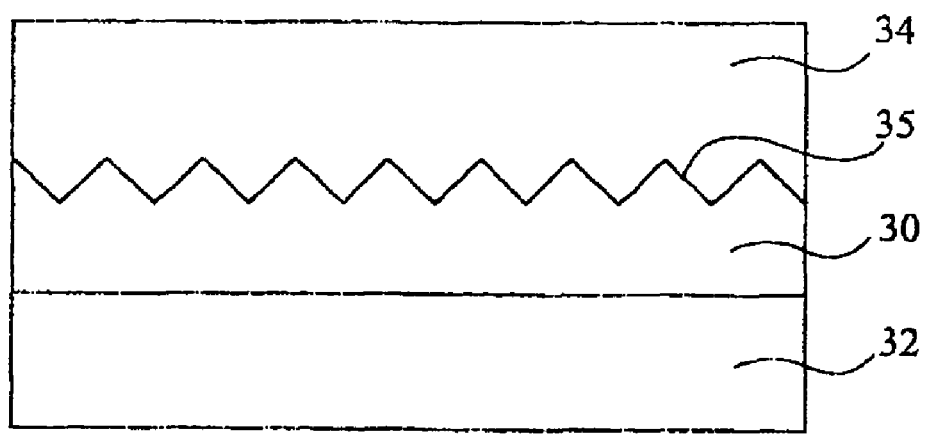
FIGS. 5a and 5b illustrate other embodiments of the method according to the present invention.

FIG. 5a illustrates a method according to the present invention in which a layer of semiconductor powders 30 is placed between a lower plate 32 of planar surface and an upper plate 34 having its lower surface exhibiting indentations 35. Indentations 35 may have a size on the order of one fifth of the thickness of layer 30. In the compression step(s), the lower surface of plate 34 prints the pattern of indentations 35 in layer 30. The material obtained by sintering of layer 30 faithfully keeps, at its surface, the pattern transmitted by plate 34. The texture of the material surface thus is perfectly controlled and it may for example be adapted to a better absorption of light. It goes without saying that it is preferable to carry out, in this case, the thermal processing leading to the partial melting during the compression step, to optimally keep the pattern transferred by the plate. Of course, the partial melting may also occur after, if the pattern modification due to the melting does not adversely affect the desired features.

Figure 5B:
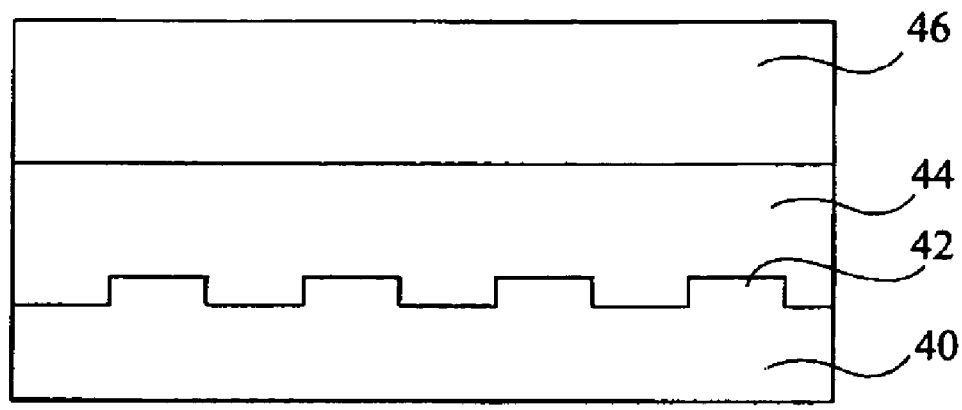

FIG. 5b illustrates another example of a texture that may be obtained at the surface of a material according to the present invention. A lower plate 40 exhibits parallel parallelepipedal ribs 42. A bed of semiconductor powders 44 is placed on plate 40 and topped with an upper plate 46 of planar surface. After implementation of the method according to the present invention, the obtained material exhibits at its surface parallel depressions corresponding to the ribs of plate 40. As will be seen hereafter, such depressions may be filled with another material.

Various ways of doping the material according to the present invention will now be described through a few examples, in relation with FIGS. 6, 7A to 7C.

First, in the method of the present invention, it is possible to use previously-doped powders of semiconductor materials. The sintering of such powders provides a readily-doped material.

The obtained doping may be homogenous, when powders of a specific doping type, N or P, are uniformly distributed between the compression plates. Separate areas exhibiting a doping of different type and concentration may also be formed within the material by adequately distributing more or less heavily doped N- or P-type powders.

As seen, in the case of a mixture of pure silicon and doped silicon powders, the liquid phase may be obtained by only melting the doped powders. It should be noted that this further provides the advantage of decreasing down to almost zero the porosity of the doped areas. It may also be provided to only melt some of the doped areas.

A doped material may also be obtained by sintering a bed of undoped semiconductor powders to which are mixed dopants or impurities in the form of powders, such as boron, phosphorus, antimony, arsenic, gallium, aluminum, etc. It should be noted that these components melt easily and that, in melting, they optimize the microstructure of the area where they are present.

A homogenous doping of the material may also be obtained by means of undoped powders and by flowing a gas carrying dopant elements in the implementation of the method according to the present invention. Indeed, at the beginning of the processing, the porosity of the powder bed is very high, for example, on the order of 50%. The porosity is said to be open, that is, there exists, within the powder bed or the material being formed, interconnected circulation channels emerging outside. If a dopant gas then flows, the dopant gas spreads throughout the entire material and dopes it uniformly. The partial melting step, which clogs the porosity channels, must only take place after the doping or in areas which do not involve it.

To form a PN junction, an N-type material may be formed by sintering of powders. It is locally melted, for example, at its surface. It is then doped with a P-type doping via porosities, for example, by a gas. The portions which have not melted are P-type doped, while the portions having melted, with no porosity, keep the N-type doping. A large PN junction can thus be formed.

Figure 6:
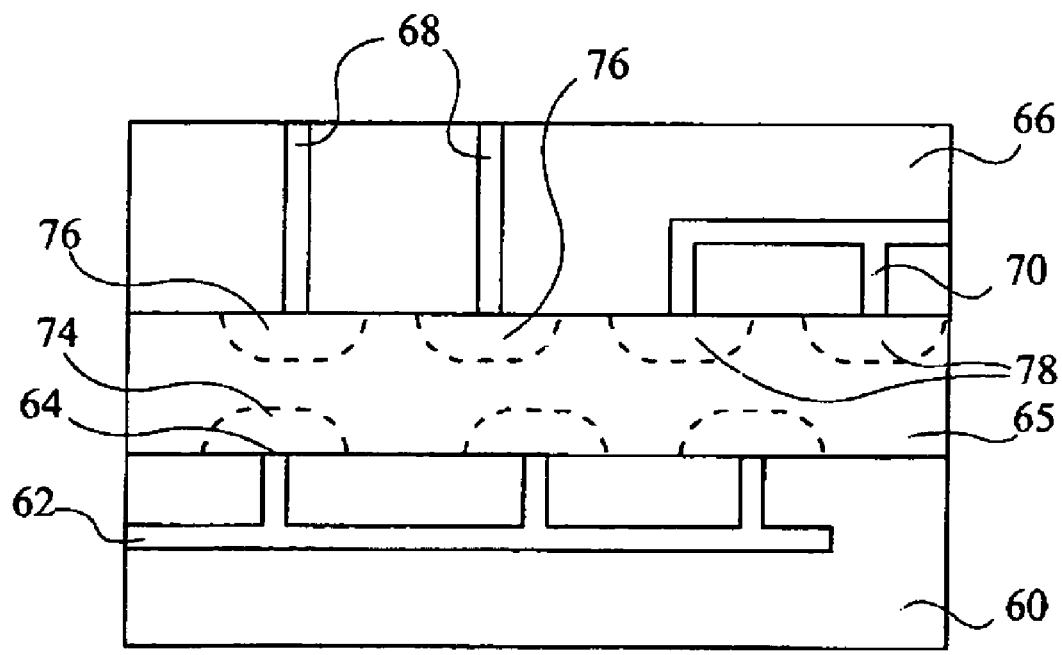
FIGS. 6, 7A to 7C illustrate ways of doping a material according to the present invention.

FIG. 6 illustrates another way of doping the material during its forming. A lower plate 60 comprises a duct 62 emerging outside. Duct 62 further comprises openings 64 located at the upper surface of plate 60. A powder bed 65 is placed on plate 60 to form the semiconductor material. A plate 66 comprising ducts 68 and 70 emerging outside and at the lower surface of plate 66 is placed above. Ducts 68 each connect the outside of the plate to a specific opening of the lower surface of plate 66. Duct 70 connects the outside of plate 66 to several openings located on the lower surface of plate 66.

In the compression step, a dopant gas, for example, of type P, is sent into duct 62. This gas, due to the large number of open porosities existing at the beginning of the forming of the material, causes, in front of openings 64, the doping of areas 74 delimited in dotted lines. According to the gas sending conditions, the different doped areas 74 may join. The thermal processing step will have to be adapted to the desired result. Indeed, the open porosities close during the thermal processing step. According to the time of action of the gas in the process, it is possible to perform local dopings. Dopant gases are also sent into ducts 68 and 70 to respectively form doped areas 76 and 78. Since it is possible to separately modify the gas sending conditions into each of ducts 68 and duct 70, a size, a doping type and concentration may be obtained for each of areas 76 and 78. "Gas sending conditions" is especially used to designate the nature, the flow rate or the pressure, the action time of the gases, the time when they act, etc.

Another way of doping the material obtained according to the present invention will now be described in relation with FIGS. 7A to 7C.

Figure 7A:
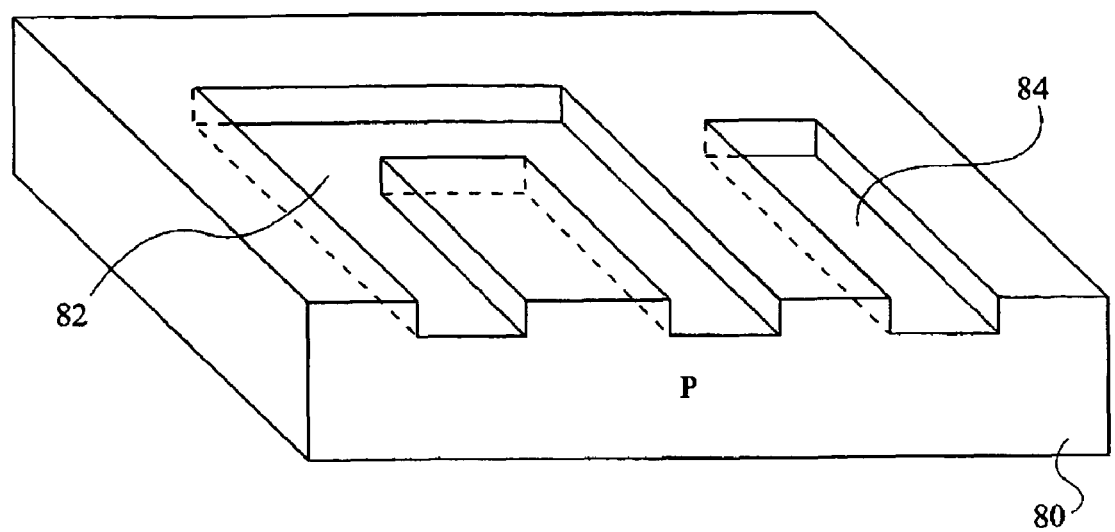

FIG. 7A schematically shows a view partially in cross-section and in perspective of a P-type material 80 obtained by sintering of powders according to the method of the present invention. Material 80 exhibits depressions 82 and 84 which have been obtained by means of a plate exhibiting protruding elements of corresponding shape, of a type similar to those of plate 40 of FIG. 5b. The width of depressions 82 and 84 may be as small as 1 μm. The edges of depressions 82 and 84 are well delimited. Depression 82 is meander-shaped and depression 84 is rectilinear. Depressions 82 and 84 are then each filled with semiconductor powders exhibiting a doping of desired type and concentration.

Figure 7B:
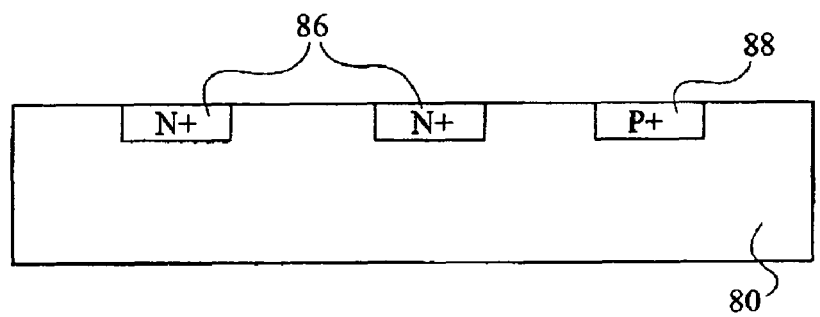

In FIG. 7B, material 80 exhibits heavily-doped N-type areas 86 ($N^+$) and a heavily-doped P-type area 88 ($P^+$). These areas have been obtained by filling depression 82 with N-type powders, and depression 84 with P-type powders, then by sintering these powders. For this purpose, the material may simply be submitted to a thermal processing step.

Figure 7C:
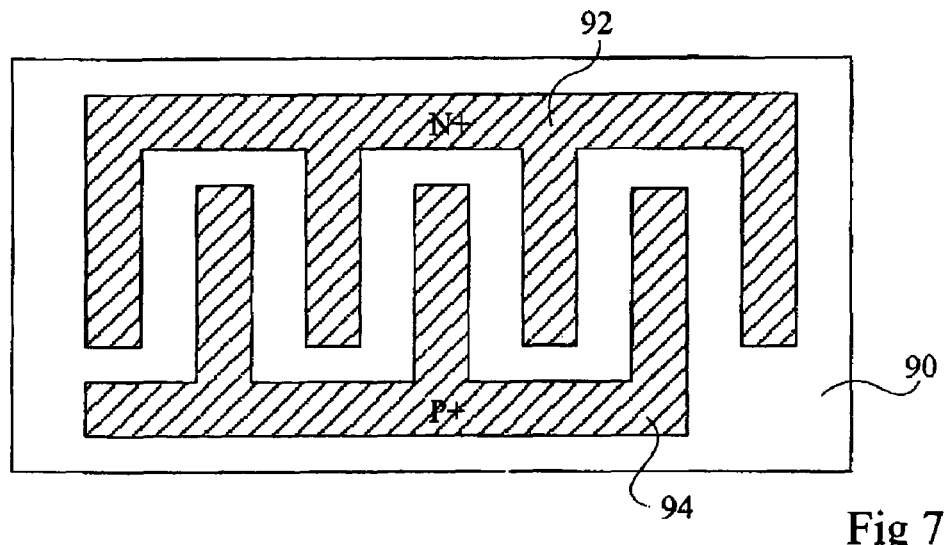

FIG. 7C shows a top view of a semiconductor material 90 according to the present invention, in which heavily-doped N-type areas 92 and heavily-doped P-type areas 94 have been obtained according to the method described in relation with FIGS. 7A and 7B. Areas 92 and 94 are interdigited. The surface comprising areas 92 and 94 is intended to be the surface unexposed to light. This makes the forming of a collector comb such as comb 5 of FIG. 1 useless and correspondingly increases the lit surface of the photocell.

It should be noted that the materials comprising PN junctions described hereabove are components very close to the end product embodied by a photocell. The method according to the present invention enables further approximating the end product.

On the one hand, when the PN junction is across the thickness of the material, it is possible to place a bed of aluminum powders at the base of the semiconductor powder bed in the material manufacturing. The material obtained after sintering thus comprises the lower conductive layer, which no longer needs being deposited afterwards. A heavily-doped P-type area, such as area 3c of FIG. 1, is naturally produced at the contact between the P-type material and the aluminum. A thin layer of heavily-doped P-type powders, for example, from one to a few micrometers, can thus be placed on the layer of aluminum powders on manufacturing of the material. The upper collector comb may also be formed on formation of the material, by placing adequate powders, such as aluminum powders, at the appropriate locations. Transparent conductive ceramic powders may also, for the transmission of current, be placed over the entire surface of the material exposed to light.

On the other hand, when the PN junction is at the surface, as in FIG. 7C, conductive powders may be deposited on the powders intended to form the doped areas (non-lit surface of the material) before their thermal processing. The obtained material thus comprises two interdigited conductive areas, which form particularly efficient collectors of the carriers created by photoelectric effect.

A material according to the present invention obtained by sintering of semiconductor powders of different nature will now be described. The used powders may belong to any element of column IV of the Mendeleiev table, and/or to their alloys.

Figure 8:
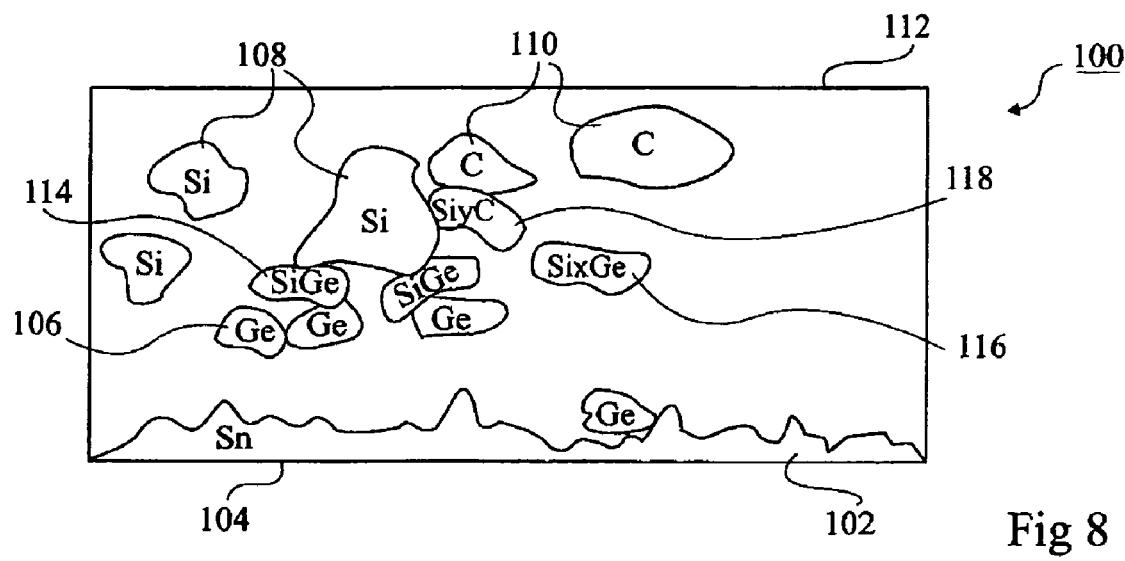
FIGS. 8, 9, and 10 show materials according to the present invention.

FIG. 8 schematically shows a top view of a material 100 according to the present invention. Material 100 has been obtained, for example, by application of the method according to the present invention to a bed of powders comprising powders of tin Sn, germanium Ge, silicon Si, and carbon C. An area 102 formed of tin runs along edge 104 of material 100. Area 102 results from the sintering of tin powders placed along lateral edge 104. The uneven contour of area 102 can especially be explained by the fact that tin melts at temperatures used in the method and tends to spread into the open porosities of the material. Material 100 also comprises islets 106 of germanium Ge, resulting from the sintering of germanium powders. Similarly, the silicon powders create silicon islets 108 and the carbon powders which, in the shown example, have been deposited rather towards edge 112 of the material, create islets of carbon C.

Further, material 100 comprises islets 114 of SiGe alloy, islets 116 of $Si_xGe$, $Si_yC$ islets 118. The material may also comprise $Ge_xC$ and $Si_xGe_yC$ islets. Such alloys appear at the contact of the grains of different nature in the thermal processing, the various grains aggregating by sintering. If this is desired, the forming of these alloys may be limited by placing the powders of different nature so that they avoid mixing too much. Powders of various alloys may also be arranged in the bed of powders to be sintered, to increase the proportion of the alloys. Further, the used powders or the obtained materials may be doped as described hereabove.

It should be noted that with conventional methods for manufacturing semiconductor materials, such as methods using melts, only homogenous alloys may be obtained and a "composite" material such as material 100 cannot be obtained.

Material 100 is particularly advantageous in photovoltaic applications.

Indeed, the wavelength of the radiations absorbed by a semiconductor element depends on the value of the energy gap of this element. Thus, silicon, having an energy gap of 1.1 eV, is naturally optimized for visible light. Infrared radiations are practically not absorbed by silicon. Ultraviolet radiations, as for them, are rapidly absorbed by silicon, but the excess energy represented by the difference between the energy of the radiation and the value of the energy gap is lost. Germanium, having a 0.7-eV energy gap, is particularly well adapted to absorb infrared light. An alloy of $Si_xGe$ type has an energy gap ranging between the energy gap of silicon and that of germanium. An $Si_xC$-type alloy has a much greater energy gap than that of silicon. An alloy of this type responds particularly well to blue and ultraviolet radiations.

As a result, material 100 has a locally variable energy gap. This is an extremely significant advantage, since the radiations can be used at best in a photovoltaic application. For example, material 100 may practically respond to the entire solar spectrum, which is not the case for a conventional silicon photocell.

Figure 9:
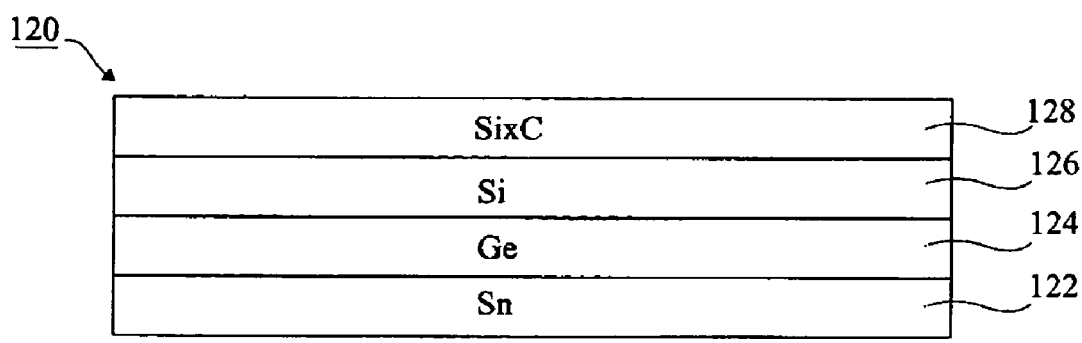

FIG. 9 schematically shows a bed of powders 120 intended for the forming of a material according to the present invention. Powder bed 120 comprises a lower layer 122 of tin powders, followed by a layer 124 of germanium powders, followed by a layer 126 of silicon powders, the assembly being topped with a layer 128 of powders of a carbon and silicon alloy $Si_xC$. The layers of powders 122, 124, 126, and 128 are arranged by increasing energy gap order.

After sintering, the obtained semiconductor material thus comprises several superposed layers of materials of different energy gaps. In a photovoltaic application, the surface of the material comprising the layer with the larger energy gap, $Si_xC$, is exposed to light. Alloy layer $Si_xC$ absorbs the ultraviolet radiation and around and lets through visible and infrared radiations. The silicon layer absorbs the visible light and is practically transparent to infrared radiations, which are absorbed by the germanium layer. Various alloys created during the sintering help the absorption of the radiation. The tin layer, buried, is mainly used to collect the carriers created by the photovoltaic effect. As previously, a PN junction may be formed by an appropriate doping.

As compared with the material of FIG. 8, the material obtained by the powder bed of FIG. 9 is advantageous in that the radiations successively cross layers of decreasing energy gaps. This enables more complete absorption of the radiation.

Of course, the present invention is not limited to the described examples and any variation, modification, or the like within the abilities of those skilled in the art belongs to the field of the present invention.

In particular, the plates used to compress the powder bed are not necessarily planar and may have any shape.

Figure 10:
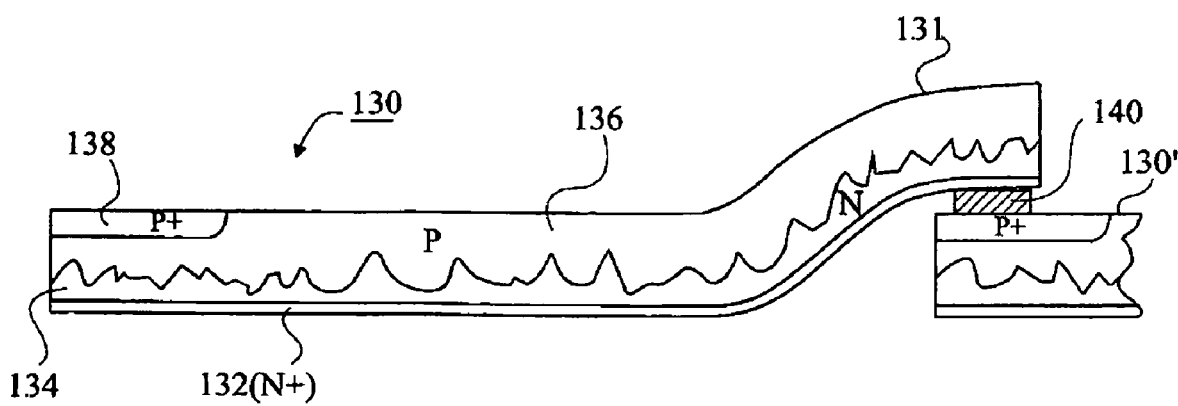

FIG. 10 thus shows a tile-shaped semiconductor material 130 that may integrate to the structure of a roof. Material 130, which will be called tile hereafter, comprises a non-planar end 131 enabling covering the next tile 130' and connecting thereto. Tile 130 is obtained by sintering of a bed of semiconductor powders by means of plates of corresponding shape. The powder bed has been formed to successively create a thin heavily-doped N-type layer 132 ($N^+$), an N-type doped layer 134, followed by a P-type doped layer 136. At the end opposite to end 131 is a heavily-doped P-type area of small extension 138 ($P^+$). Tile 130 is connected to tile 130' by any conductive attachment means 140, such as a welding or a flexible wire, connecting the $N^+$ layer of a tile to the $P^+$ area of the next tile. The photocells formed by tiles 130 and 130' are thus series-connected. Various other ways of grouping a set of tiles, in series and/or in parallel, provide the desired features of an installation.

It should be noted that, for the melting step, any appropriate means, such as resistive furnaces, lamp furnaces, solar furnaces, etc. may be used, the power being transferred by conduction, convection, radiation, etc.

It should also be noted that any structure or component comprising or formed of one or several materials according to the present invention belongs to the field of the present invention.

It should also be noted that the materials according to the present invention are not limited to the materials obtained by the method according to the present invention. For example, any semiconductor material comprising grains and/or aggregates exhibiting different energy gaps belongs to the field of the present invention, whatever its obtaining mode.

The invention claimed is:
1. A method for forming a semiconductor material from powders comprising at least one component belonging to the group formed by the elements of column IV of the Mendeleiev table and their alloys, said method comprising;
one or more steps of compression of said powders; and
one or more thermal processing steps such that at least part of the powders is melted or made viscous, wherein, at least one of the one or more compression steps and at least one of the one or more thermal processing steps are simultaneous, and wherein at least one of the one or more thermal processing steps is such that only powders belonging to a specific area of the material are melted or made viscous.

2. The method of claim 1, wherein during the compression step, said powders are pressed between plates having a surface capable of texturizing the surface of the material.

3. A semiconductor material obtained at least partially by compression and thermal processing of powders comprising at least two distinct areas formed of distinct components belonging to the group formed by the elements of column IV of the Mendeleiev table and the alloys thereof.

4. The material of claim 3, wherein said areas are superposed.

5. A method for forming a semiconductor material from powders comprising at least one component belonging to the group formed by the elements of column IV of the Mendeleiev table and their alloys, said method comprising:
one or more steps of compression of said powders; and
one or more thermal processing steps such that at least part of the powders is melted or made viscous,
wherein, at least one of the one or more compression steps and at least one of the one or more thermal processing steps are simultaneous, and
wherein the powders comprise silicon powders and powders of at least another component, the thermal processing being such that the silicon is not melted and that at least one of the other components is melted or made viscous.

6. A method for forming a semiconductor material from powders comprising at least one component belonging to the group formed by the elements of column IV of the Mendeleiev table and their alloys, said method comprising:
one or more steps of compression of said powders; and
one or more thermal processing steps such that at least part of the powders is melted or made viscous,
wherein, at least one of the one or more compression steps and at least one of the one or more thermal processing steps are simultaneous, and
wherein the powders comprise doped semiconductor powders and undoped semiconductor powders, the thermal processing being such that only the doped powders are melted.

7. A method for forming a semiconductor material from powders comprising at least one component belonging to the group formed by the elements of column IV of the Mendeleiev table and their alloys, said method comprising:
one or more steps of compression of said powders; and
one or more thermal processing steps such that at least part of the powders is melted or made viscous,
wherein, at least one of the one or more compression steps and at least one of the one or more thermal processing steps are simultaneous, and
wherein the compression step is preceded by a step consisting of placing powders on a plate, the powders being different as to at least one of their nature, their granulometry, and their doping according to their location on the plate.

8. A structure or a component formed of one or comprising at least one semiconductor material comprising grains and/or aggregates exhibiting energy gaps of different value, wherein the grains and/or aggregates comprise at least two elements of column IV of the Mendeleiev table, or wherein the grains and/or aggregates comprise at least one element of column IV of the Mendeleiev table and at least one alloy of an element of column IV of the Mendeleiev table.

9. A method for forming a semiconductor material from powders comprising at least one component belonging to the group formed by the elements of column IV of the Mendeleiev table and their alloys, said method comprising a step of compression of said powders and a thermal processing step such that at least part of the powders is melted or made viscous,
wherein the thermal processing is such that only powders belonging to a specific area of the material are melted or made viscous.

10. A method for forming a semiconductor material from powders comprising at least one component belonging to the group formed by the elements of column IV of the Mendeleiev table and their alloys, said method comprising a step of compression of said powders and a thermal processing step such that at least part of the powders is melted or made viscous,
wherein the powders comprise silicon powders and powders of at least another component, the thermal processing being such that the silicon is not melted and that at least one of the other components is melted or made viscous.

11. A method for forming a semiconductor material from powders comprising at least one component belonging to the group formed by the elements of column IV of the Mendeleiev table and their alloys, said method comprising a step of compression of said powders and a thermal processing step such that at least part of the powders is melted or made viscous,
wherein the powders comprise doped semiconductor powders and undoped semiconductor powders, the thermal processing being such that only the doped powders are melted.

12. A method for forming a semiconductor material from powders comprising at least one component belonging to the group formed by the elements of column IV of the Mendeleiev table and their alloys, said method comprising a step of compression of said powders and a thermal processing step such that at least part of the powders is melted or made viscous,
wherein the compression step is preceded by a step consisting of placing powders on a plate, the powders being different as to at least one of their nature, their granulometry, and their doping according to their location on the plate.

* * * * *